United States Patent [19]

Pinternagel

[11] 4,314,207

[45] Feb. 2, 1982

[54] TRANSISTOR AMPLIFIER

[76] Inventor: Werner Pinternagel, Siemensstrasse 50, D-8440 Straubing, Fed. Rep. of Germany

[21] Appl. No.: 49,731

[22] Filed: Jun. 18, 1979

[30] Foreign Application Priority Data

Oct. 31, 1978 [DE] Fed. Rep. of Germany ....... 2847363

[51] Int. Cl.³ .............................................. H03G 3/00
[52] U.S. Cl. .................................. 330/110; 330/282
[58] Field of Search ............... 330/110, 86, 282; 307/229, 230; 328/171

[56] References Cited

U.S. PATENT DOCUMENTS 3,153,152 10/1964 Hoffman ................... 330/110 X
3,436,559 4/1969 Wajs ........................... 307/229

OTHER PUBLICATIONS

Wentworth, "'Soft Limiting' in Audio Power Amplification", *IEEE Transactions on Audio and Electroacoustics*, Sep. 1970, pp. 313-315.

*Primary Examiner*—James B. Mullins
*Attorney, Agent, or Firm*—Paul H. Gallagher

[57] ABSTRACT

A transistor amplifier utilizing AC, for an orchestral instrument, having a non-inverting input, with a predetermined range of linear amplification, a feedback means including a first path independent of transistors for controlling the input within said predetermined range, a supplementary path parallel with said first path and including a zener diode having a breakthrough point at the upper limit of said range, and a plurality of auxiliary paths having breakthrough points higher than that of the supplemental path, and each including a resistor and a zener diode, and arranged with the resistors in parallel and the zener diodes in series, forming a cascade arrangement, and the auxiliary path together being in parallel with the first path.

5 Claims, 5 Drawing Figures

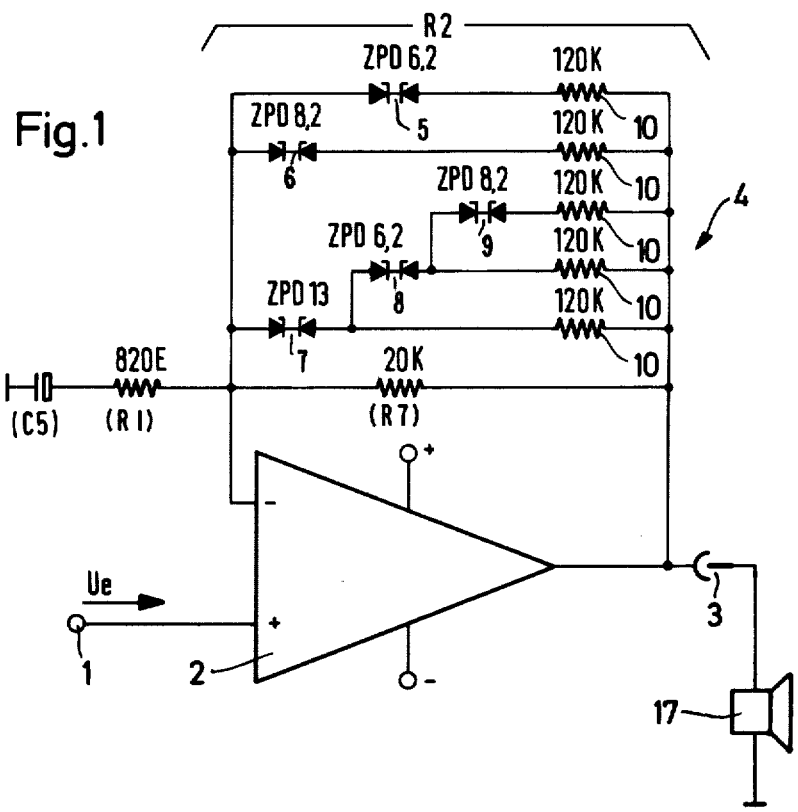

TRANSISTOR AMPLIFIER

The invention relates to a transistor amplifier for orchestra installations which is modulated up to its normal output and the degree of amplification in a given modulation range is constant up to the normal output.

The present conventional circuits of transistor end stages are designed mainly for output operating amplifiers. Thus these are very low resistance in output. Thus inner resistances of about 0.1 ohm are given. By means of high counter coupling linear amplification factors can be reached which allow of achieving a straight line amplification curve up to the clipping insert. The clatter factor within this linear range is too far below one percent and is thereby practically still measurable but not audible.

After reaching the modulation limit of the transistors there is given with the clipping insert a very steep increase of the clatter factor with which without greater transition a very strongly perceptible large distortion takes place which is shown on the oscillograph screen as a "saw-tooth" curve. If it is desired to use a transistor amplifier for singing performances and very dynamic playing or compositions with instruments, then it is found to be disadvantageous by musicians in that with sound intensity peaks or long and constant overmodulation of the clatter factor beyond the clipping insert, increases so strongly that the whole performance is thus disturbed.

Whilst with home apparatus, for example, amplifiers for radio, stereo, tape and Hifi installations, all sound frequency recordings are turned before reproduction by hand or automatically below an overmodulation limit that is completely otherwise with orchestra amplifiers: The voltage level increase in unregulated form, for example, upon hard striking of the strings of a guitar, an electro bass whereby suddenly a multiple of the normal level is reached which leads to extreme overmodulations Furthermore during the singing with dancing movements for example a singer varies the distance of the microphone from the mouth such that the microphone as a sound pressure receiver suddenly gives a multiple of its average voltage to the amplifier.

The objective of the present invention is to develop a transistor amplifier of the abovementioned type such that even upon exceeding its normal output—as frequently occurs with music amplifiers—the clatter factor does not increase so sharply that the musical performance in this modulation range is falsified. The objective of the present invention is therefore to obviate the sharp insertion of the clipping effect upon exceeding the normal output of the transistor amplifier. For the solution of the problem the invention is characterised in that on reaching the normal output the amplification is automatically reduced.

The essential feature of this technical instruction is therefore that upon exceeding the normal output of the transistor amplifier nevertheless a smaller clatter factor is given because upon exceeding the normal output the amplification is automatically reduced. A suitable method for this is to divide the counter coupling resistance of the transistor amplifier into several individual resistances and to connect these with increasing modulation of the amplifier such that the whole amplification is thereby decreased corresponding to the electrical dimensioning. It is therefore essential to have a resistance present in the counter coupling branch of the amplifier the resistance value of which decreases with higher input voltage of the amplifier.

In a first embodiment of the present invention it is arranged that in the counter coupling branch of the amplifier parallel connected resistances are provided, and respective zener diodes having breakthrough points at increasing voltage. With increasing input voltage the successive zener diodes succeed in breakthrough and accordingly connect successively in parallel a number of resistances always becoming higher so that the resistance in the counter coupling branch decreases in dependance on the input voltage.

In a second embodiment of the present invention it is arranged that the resistances are connected by electronic switches (for example, MDS-FET-switches) in dependence on the input voltage.

In a further embodiment it is arranged that the resistance reduction of the resistance connected in the counter coupling branch is effected electronically (photo cells one light diode lies opposite, the light emission of which depends on the input level). Likewise the resistance in the counter coupling branch may be a temperature dependent heated resistance in which the heater power supplied depends on the input current of the amplifier.

The invention will now be explained more precisely with reference to the accompanying drawings illustrating one embodiment representing only one method of construction.

FIG. 1 shows diagrammatically a circuit diagram of a first embodiment;

FIG. 2 shows a table for indicating the dependence of the circuit thresholds of the zener diodes on the amplification;

Figure 5:
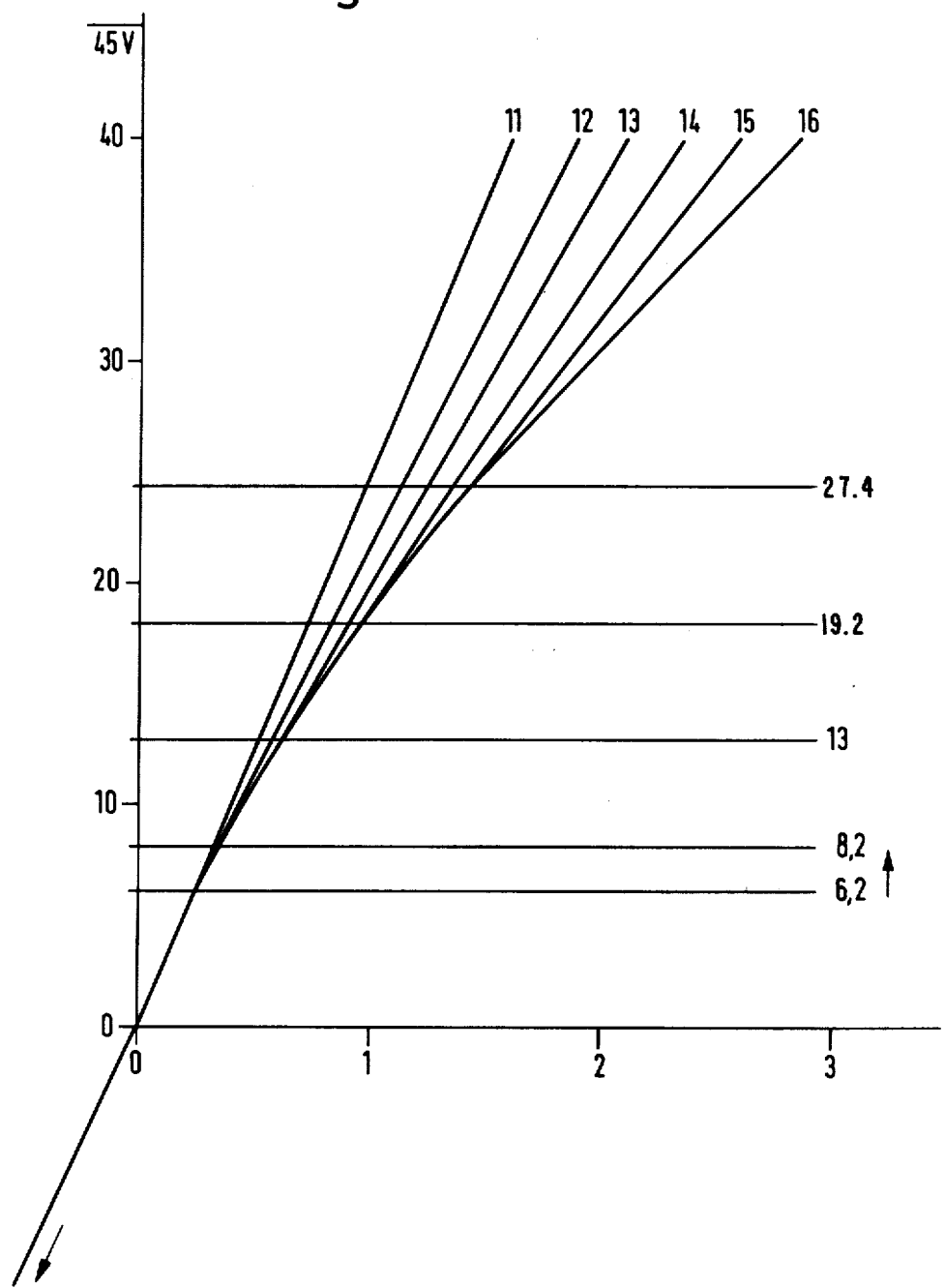

FIG. 5 shows a representation of the ratio of input voltage to ouput voltage showing that with 5 zener diodes a bent curve 16 is obtainable. In FIG. 1 a transistor amplifier 2 usual in the trade is shown which for example has 80 watt output capacity. The low frequency voltage to be amplified is placed on the input terminal 1 whilst the loud speaker 17 is connected to the output terminal 3.

On the inverting input of the amplifier 2 there is connected via the earth a condenser C5 and in series a resistance R1 and a resistance combination R2. The resistance combination R2 is in the counter coupling branch 4 of the amplifier 2.

The function of the zener diodes 5 to 9 will now be explained in conjunction with FIG. 2. If according to line 1 of the table in FIG. 2 the voltage dropping at the resistance R7 is smaller than 6.2 volts then the circuit threshold of the zener diode 5 is not exceeded so that according to line 1 of the table, the resistance R7 in the counter coupling branch 4 is effective as an individual resistance R2.

If the voltage drop at R7 exceeds the value of 6.2 volts then the zener diode 5 switches through and connects the 120KOhm resistance 10 in parallel with the resistance R7. There is for R2 thus a resulting resistance of 17.1KOhm and the amplification drops from 25.4 to 21.9. Similarly to this description then at 8.2 volts a voltage drop connects at the resistance R7 additionally to the zener diode 5 also through the zener diode 6 so that as a resulting resistance R2 in the counter coupling branch 4 according to line 3 of the table a value of 15KOhm and an amplification of 19.3 results.

The diodes 7, 8 and 9 are interconnected in a cascade arrangement, that is, the diodes themselves in series and together parallel with the resistance R7, and the resistances 10 related to the respective diodes in parallel, mutually and with the other resistances 10, R7. Following the same pattern, as the voltage drop exceeds 13 volts, the diode 7 breaks through along with diodes 5 and 6, and at additive values indicated diodes 8 and 9 break through. The values and resistances resulting from connecting these diodes are shown in the lower three lines of FIG. 2. If finally the voltage of 27.4 volts is exceeded then all zener diodes 5 to 9 are switched through so that as a resulting resistance for R2 there results only a value of 10.9KOhm and an amplification of 14.3. From this representation it can be seen that with increasing voltage drop at the resistance R7 the whole resulting resistance R2 in the counter coupling branch 4 decreases from 20KOhm to 10.9KOhm.

Figure 3:
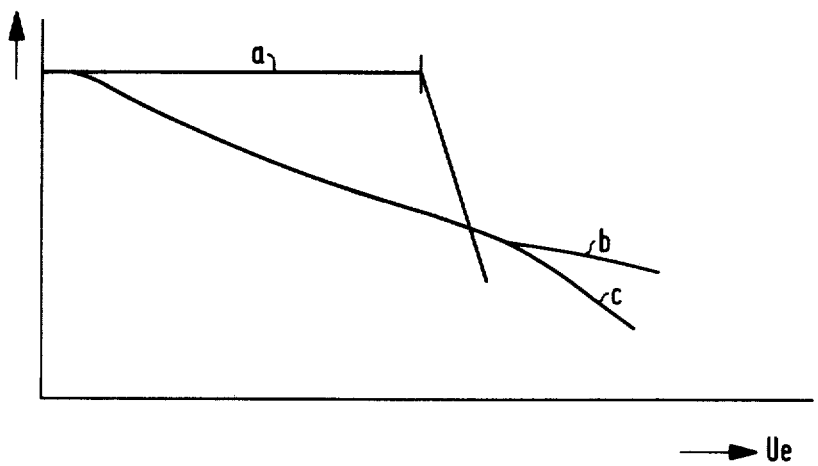
FIG. 3 shows the amplification in dependence on the modulation in which the curve a shows a circuit arrangement without diodes, curve b a circuit diagram with diodes and without charge at the output and curve c a circuit arrangement with diodes and with charge at the output of the amplifier.
Figure 4:
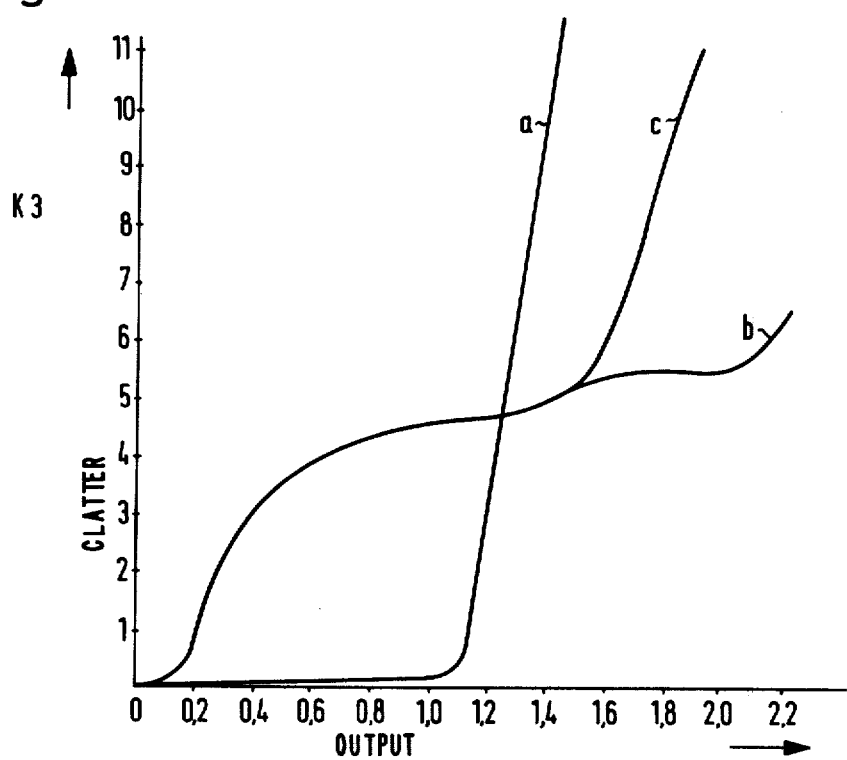
FIG. 4 shows a representation of the clatter factor in dependence on the modulation whereby curve a shows a circuit arrangement without diodes, curve b a circuit arrangement with diodes and without charge at the output, and curve e a circuit arrangement with diode and 8 ohm charge at the output.

FIG. 3 shows the dependence of the amplification in comparison with the input voltage for three different cases of use:

The curve a shows a circuit arrangement in which, for example, only one resistance R7 is present (whereby it can be seen) so that from a certain input voltage the amplification reduces very much, and according to FIG. 4 at the same time the clatter factor increases very much.

The curves b and c show that with the use of diodes the amplification is throttled with increasing input voltage so that according to the curves b and c in FIG. 4 the clatter factor increases only very slowly.

In FIG. 4 (it can be seen that) a conventional transistor amplifier works according to the curve a (whereas) according to the present invention in the curves b and c the clatter factor increases only slowly with increasing amplification so that a sharper insertion of the clipping effect (according to the invention) is obviated.

FIG. 5 shows how with the aid of the 5 zener diodes 5 to 9 finally a curve 16 is produced. If the curve in FIG. 5 proceeding from the co-ordinate cross is taken upwards then first of all one travels on the curve 11 until the voltage line of 6.2 is bisected where the zener diode 5 is switched on so that the curve 11 merges now into the curve 12. In the point of intersection with the voltage curve 8.2 volts the curve 12 merges into the curve 13 which in its turn at the point of intersection merges with the voltage line 13 volts into the curve 14 which then at the point of intersection of the voltage line 18.2 volts merges into the curve 15 which in its turn then at the point of intersection with the voltage line 27.4 volts merges in the curve 16. This curve 16 resulting therefrom shows that a non linear connection between the output voltage and the input voltage is given so that the clatter effect upon exceeding the normal output increases only slowly.

Regarding FIG. 4 it will be observed that a similar diagram results if the clatter effect is laid on the ordinate against the output capacity on the abscissae. With the modulation value 1.0 then the normal output of 80 watts would be reached. From this it can be seen that with a conventional transistor amplifier which follows the curve course of the curve a the clatter effect increases jerkily so that such an amplifier is practically unusable for musical performances beyond the normal output. It is also clear that the clatter factor with the curves b and c upon exceeding the normal output (1.0 of the value of the modulation) increases only slowly so that the transistor amplifier according to the invention is eminently suitable for a music amplifier with high dynamic even beyond the normal output range.

In the embodiment of FIG. 1. zener diodes 5 to 9 connected against one another have been used in order to avoid a circuit hysteresis.

I claim:

1. A transistor amplifier utilizing AC for an orchestral instrument, the amplifier having a predetermined range of operation in which modulation amplification is straightline constant up to a normal output beyond which the amplifier would normally be saturated, a feedback means, and an output voltage from the amplifier applied through the feedback means controlling the input, comprising,
a non-inverting input,
the feedback means including,
(a) a first path independent of transistors operative for feeding back an output voltage on the input for controlling the input up to the upper limit of said range,
(b) a supplementary path parallel with the first path and including a zener diode having a breakthrough point at the upper limit of said range,
(c) a plurality of auxiliary paths, having respectively different break-through points at different points beyond said range,
whereby the feedback means produces linear transition leading from, and beyond, said range, thereby supressing clipping.

2. A transistor amplifier according to claim 1, wherein,
the feedback means includes a group of cascade paths, each having a zener diode therein, each zener diode having a breakthrough point at least as high as the upper limit of said range, one of the cascade paths being parallel with said first path, and the zener diodes in the cascade paths being in series.

3. A transistor amplifier according to claim 2, wherein,
each cascade path includes a resistor, the resistors are independent of the series arrangement of the zener diodes, and in mutually parallel relation.

4. A transistor amplifier according to claim 3, wherein, said first path includes a resistor, and that resistor is in parallel relation with the resistors in the cascade paths.

5. A transistor amplifier according to claim 2, wherein,
the feedback means includes at least one additional path parallel with the first path and cascade paths, including a zener diode and a resistor in series.

* * * * *